US012609501B2

(12) United States Patent
Lee

(10) Patent No.: US 12,609,501 B2
(45) Date of Patent: Apr. 21, 2026

(54) INTERLOCKING TYPE OUTLET DEVICE

(71) Applicant: Chang soo Lee, Paju (KR)

(72) Inventor: Chang soo Lee, Paju (KR)

( * ) Notice: Subject to any disclaimer, the term of this patent is extended or adjusted under 35 U.S.C. 154(b) by 323 days.

(21) Appl. No.: 18/396,997

(22) Filed: Dec. 27, 2023

(65) Prior Publication Data

US 2024/0235139 A1    Jul. 11, 2024

(30) Foreign Application Priority Data

Jan. 9, 2023    (KR) ........................ 10-2023-0002899

(51) Int. Cl.
*H01R 27/00*        (2006.01)
*G01R 19/00*        (2006.01)
*H01R 13/70*        (2006.01)

(52) U.S. Cl.
CPC ......... *H01R 27/00* (2013.01); *G01R 19/0092* (2013.01); *H01R 13/70* (2013.01)

(58) Field of Classification Search
CPC ..... H01R 27/00; H01R 13/70; G01R 19/0092
See application file for complete search history.

(56) References Cited

U.S. PATENT DOCUMENTS

| | | | | |
|---|---|---|---|---|
| 5,600,306 A | * | 2/1997 | Ichikawa ........... | H01R 13/6683 |
| | | | | 361/93.3 |
| 9,525,247 B2 | * | 12/2016 | Seff ...................... | G01R 19/165 |
| 2013/0015706 A1 | * | 1/2013 | Chien .................... | G06F 1/266 |
| | | | | 307/38 |
| 2013/0140894 A1 | * | 6/2013 | Lee ...................... | H01R 25/003 |
| | | | | 307/39 |
| 2019/0027880 A1 | * | 1/2019 | Kim ........................ | H02J 9/005 |

FOREIGN PATENT DOCUMENTS

| | | | | |
|---|---|---|---|---|
| WO | WO-2007027063 A1 | * | 3/2007 | .......... H02J 13/0005 |

* cited by examiner

*Primary Examiner* — Travis S Chambers
(74) *Attorney, Agent, or Firm* — Francis J. Maguire; WARE FRESSOLA MAGUIRE & BARBER LLP

(57)    ABSTRACT

Disclosed herein is an interlocking type outlet device including a first outlet receiving power from an external power source and supplying the power to a first equipment, a second outlet receiving the power from the external power source and supplying the power to a second equipment, a first current detector connected to the first outlet and detecting that the power is supplied to the first equipment, and a switch disposed between the external power source and the second outlet and connected to the first current detector to regulate power supply to the second outlet according to power being supplied to the first equipment.

3 Claims, 5 Drawing Sheets

FIG. 4

INTERLOCKING TYPE OUTLET DEVICE

BACKGROUND OF THE INVENTION

Field of the Invention

The present invention relates to an interlocking type outlet device, and more specifically, to an interlocking type outlet device capable of operating related equipment simultaneously.

Background Art

In order for each of a plurality of workers to manufacture a product through a plurality of processes, the processes are performed after providing power to equipment corresponding to each process. When one worker manufactures a product by using a plurality of pieces of equipment, the worker may have to perform a work after operating two pieces of equipment simultaneously.

However, in order to operate the two pieces of equipment as described above, the worker needs to plug power plugs of the two pieces of equipment into an outlet one by one to supply power to the equipment. This is very inconvenient because the worker has to supply power to the two pieces of equipment one by one, and cut off the power being supplied one by one so as to stop the two pieces of equipment after completing the work.

SUMMARY OF THE INVENTION

Accordingly, it is an object of the present invention to provide an interlocking type outlet device that allows power to be interlocked and supplied to other equipment when power is supplied to one equipment.

To accomplish the above object, according to the present invention, there is provided an interlocking type outlet device including a first outlet receiving power from an external power source and supplying the power to a first equipment; a second outlet receiving the power from the external power source and supplying the power to a second equipment; a first current detector connected to the first outlet and detecting that the power is supplied to the first equipment; and a switch disposed between the external power source and the second outlet and connected to the first current detector to regulate power supply to the second outlet according to power being supplied to the first equipment. When supplying current from the first outlet to the first equipment is detected by the first current detector, by controlling the switch so that power may be supplied to the first outlet, the first equipment and the second equipment may be operated simultaneously so that work may be performed simultaneously, thereby improving user convenience.

Here, when the interlocking type outlet device further includes a power breaker disposed between the external power source and the first outlet and the second outlet to regulate the power supplied to the first outlet and the second outlet; an incoming current detector disposed at a front end of the power breaker to detect current flowing into the power breaker; and a control unit storing a normal current range flowing into the power breaker, and, when it is determined that incoming current detected by the incoming current detector is outside the normal current range, controlling the power breaker to cut off the power supplied to the first outlet and the second outlet, if an abnormal current that may be flowing into the first outlet and the second outlet is detected, the power breaker may cut off the power to the first outlet and the second outlet.

The interlocking type outlet device may further include a second current detector connected to the second outlet and detecting the power being supplied to the second equipment, and, if any one of the first current detector and the second current detector detects the power being supplied or cut off to the first equipment and the second equipment, when the control unit controls the power to be supplied or cut off to equipment corresponding to another one, the first equipment and the second equipment may perform work simultaneously, and even when any one of the first equipment and the second equipment stops working while the first equipment and the second equipment perform work simultaneously, the power may be cut off so that the other one also stops working.

Here, when the interlocking type outlet device further includes a power supply line providing a path supplying the power by connecting the external power source and the power breaker, the power breaker and the switch, the switch, the power breaker, and the first outlet, and the switch and the second outlet; and a bypass supply line provided with a plurality of power breakers and a plurality of switches, and allowing the plurality of power breakers and the plurality of switches to be bypassed, even if the power breaker and the switch are defective, the power breaker and the switch may be replaced with an extra power breaker and switch and operate.

When the interlocking type outlet device further includes a selective bypass valve selectively supplying the power to front and rear ends of the bypass supply line, if the power breaker and switch are replaced with the extra power breaker and switch and operate, the extra power breaker and switch may be selectively connected through the bypass supply line.

According to the present invention, when supplying the current from the first outlet to the first equipment is detected by the first current detector, by controlling the switch so that power may be supplied to the first outlet, the first equipment and the second equipment may be operated simultaneously so that work may be performed simultaneously, and thus, there is the effect of improving user convenience.

In addition, when an abnormal current that may be flowing into the first outlet and the second outlet is detected, there are the effects that the power breaker may cut off the power to the first outlet and the second outlet, may allow the first equipment and the second equipment to perform work simultaneously, and even when any one of the first equipment and the second equipment stops working while the first equipment and the second equipment perform work simultaneously, may cut off the power so that the other one also stops working.

In addition, even if the power breaker and the switch are defective, there are the effects that the power breaker and the switch may be replaced with an extra power breaker and switch and operate, and when the power breaker and switch are replaced with the extra power breaker and switch and operate, the extra power breaker and switch may be selectively connected through the bypass supply line.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 4 is a simplified diagram of another modifiable interlocking type outlet device.

DETAILED DESCRIPTION OF THE PREFERRED EMBODIMENT

Hereinafter, an interlocking type outlet device 1 according to a preferred embodiment of the present invention will be described in detail with reference to the attached drawings.

Figure 1:
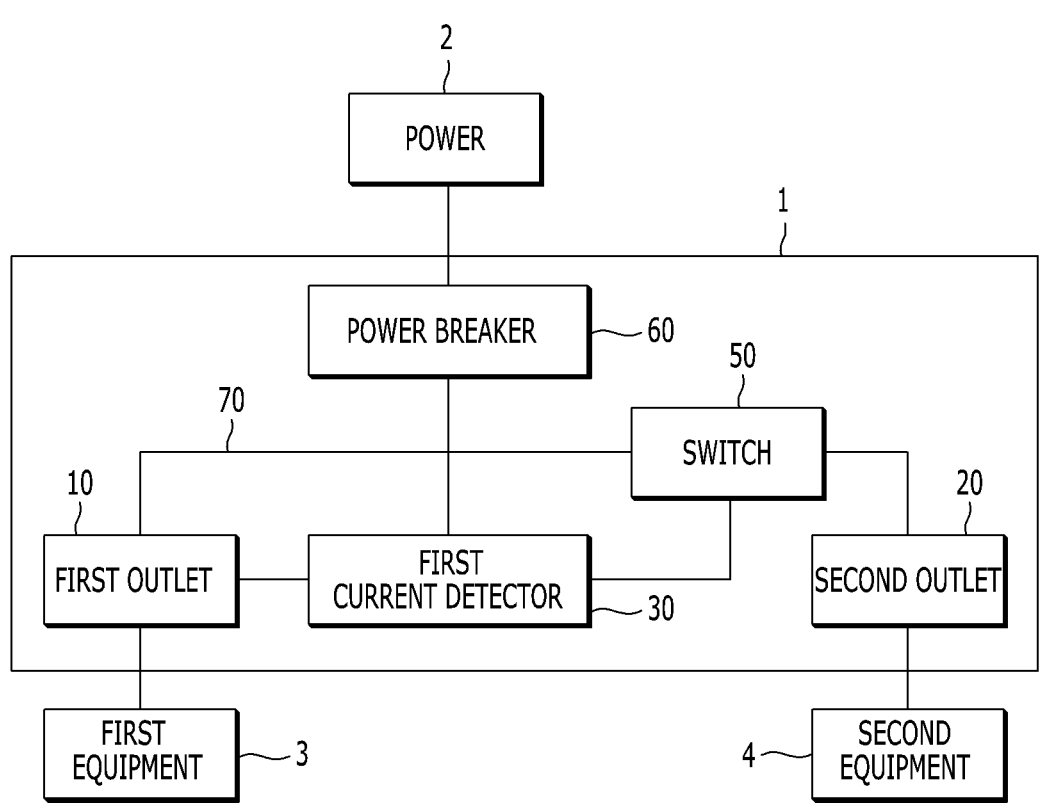
FIG. 1 is a simplified diagram of an interlocking type outlet device according to the present invention.
Figure 2:
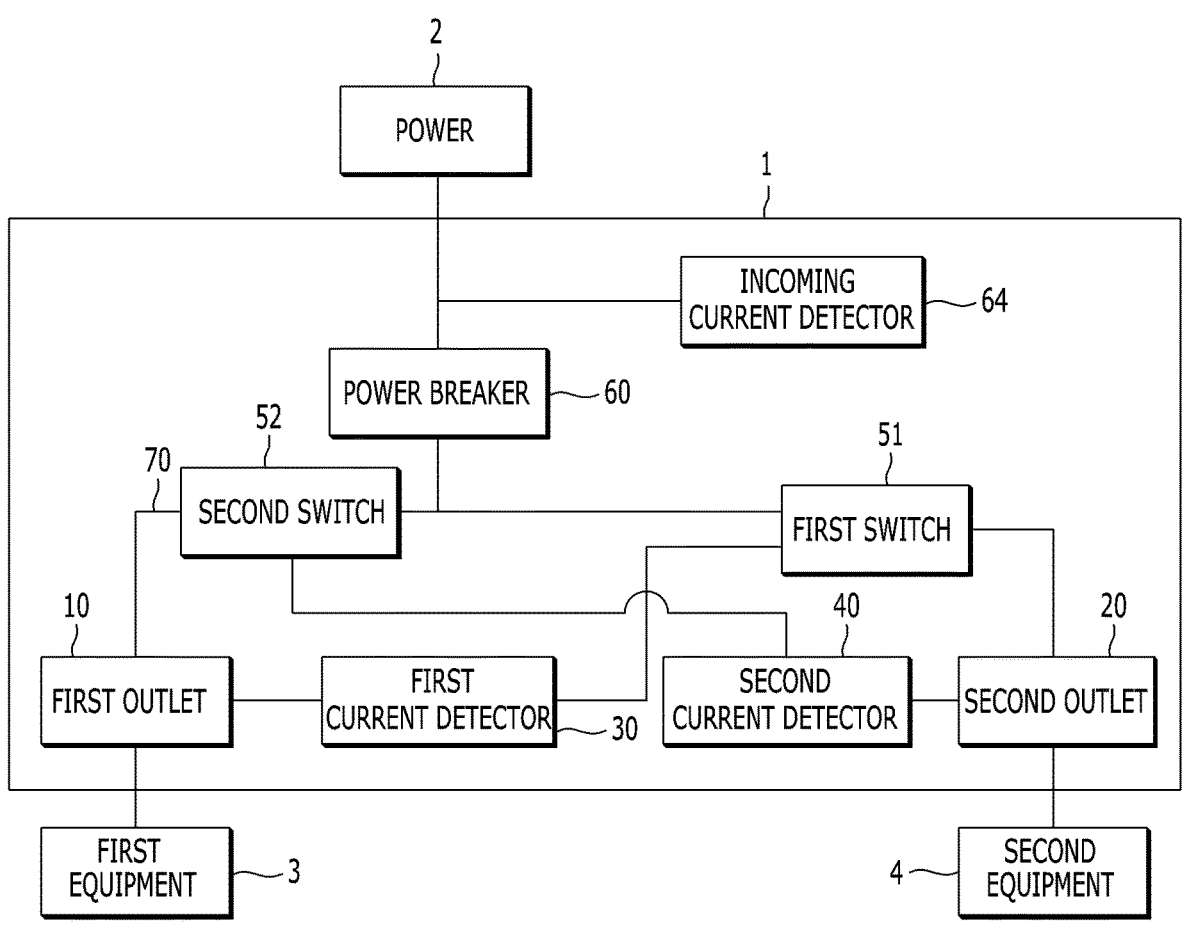
FIG. 2 is a simplified diagram of a modifiable interlocking type outlet device.
Figure 3:
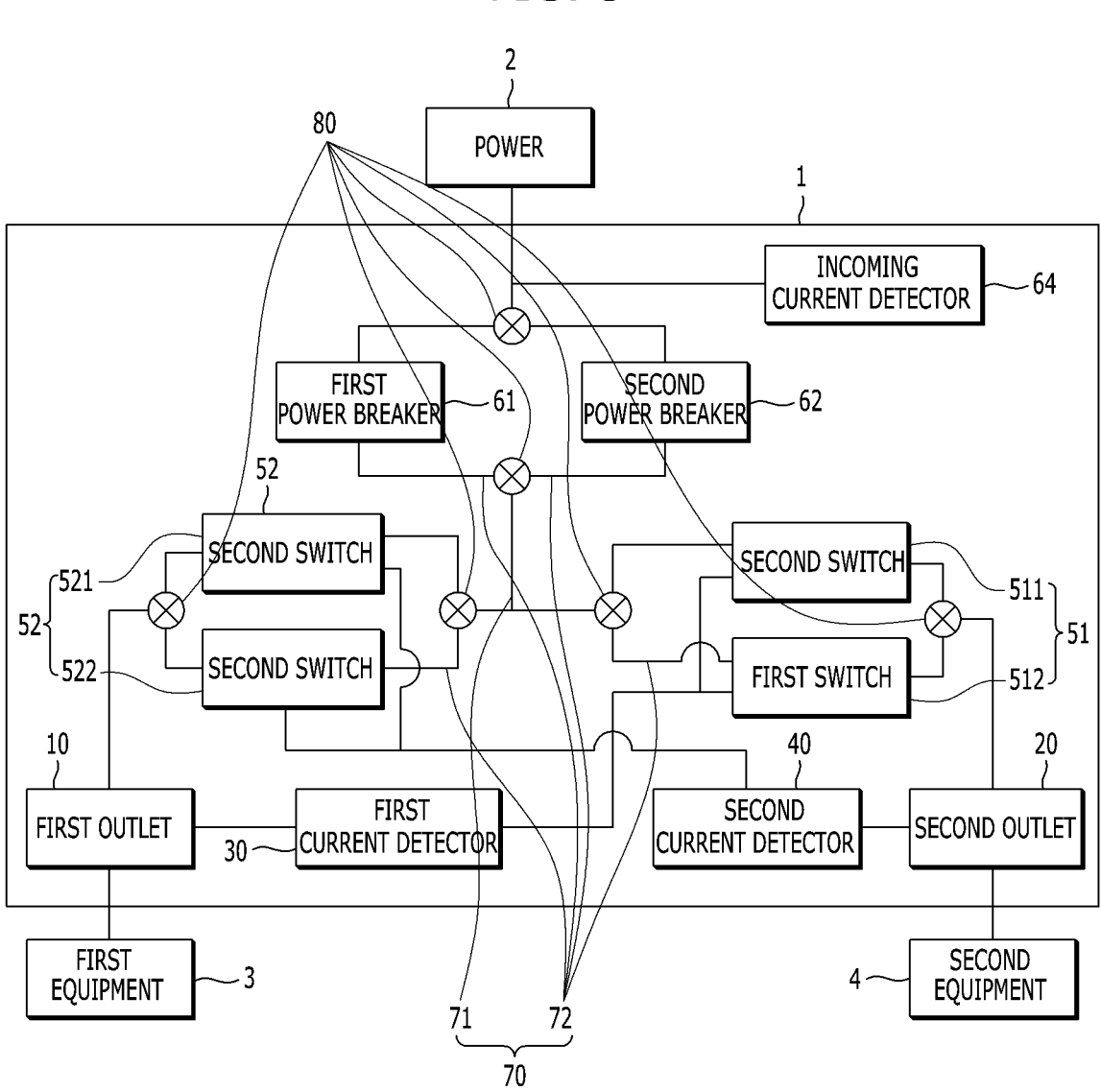
FIG. 3 is a simplified diagram of another modifiable interlocking type outlet device.
Figure 4:
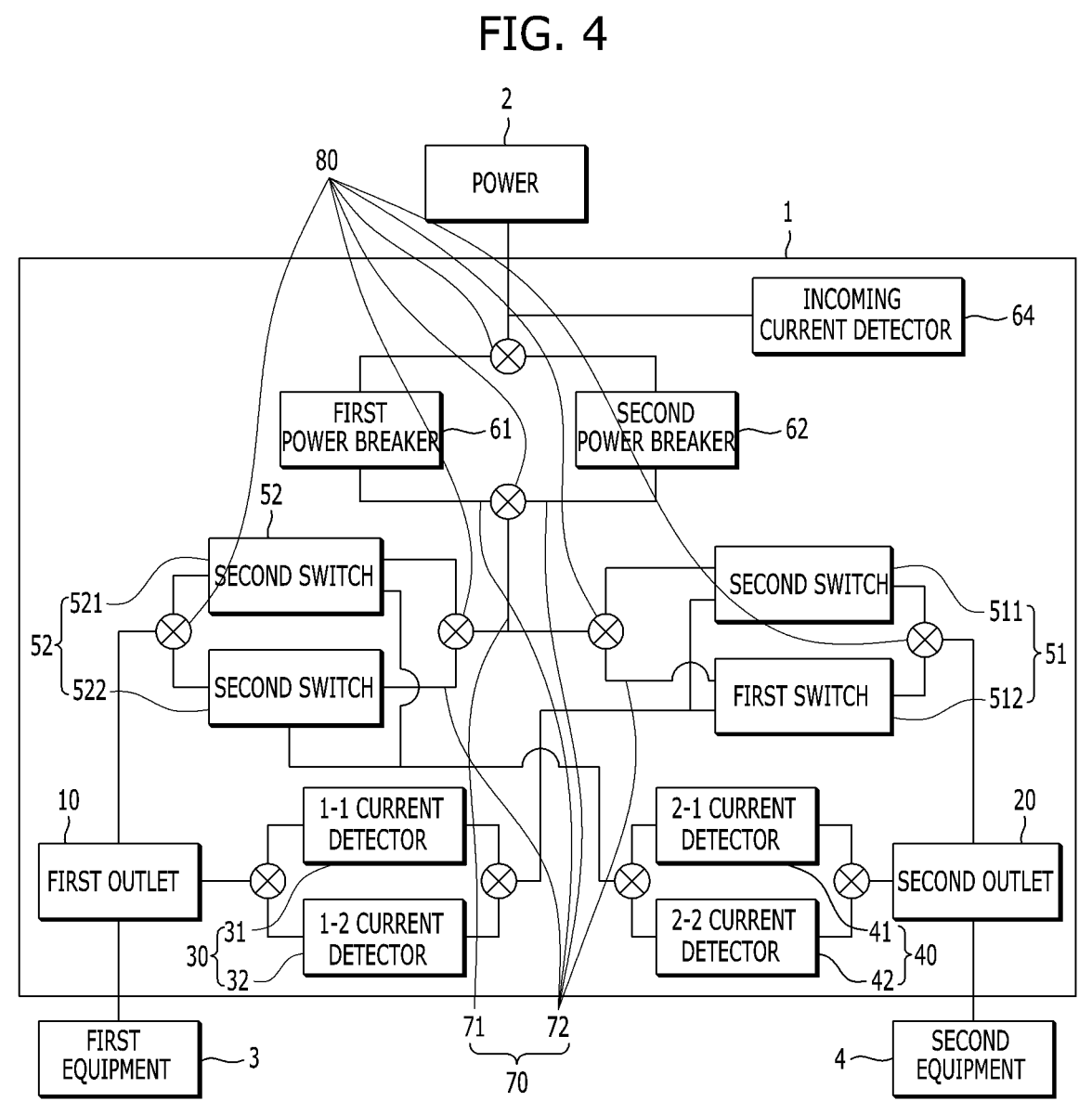
Figure 5:
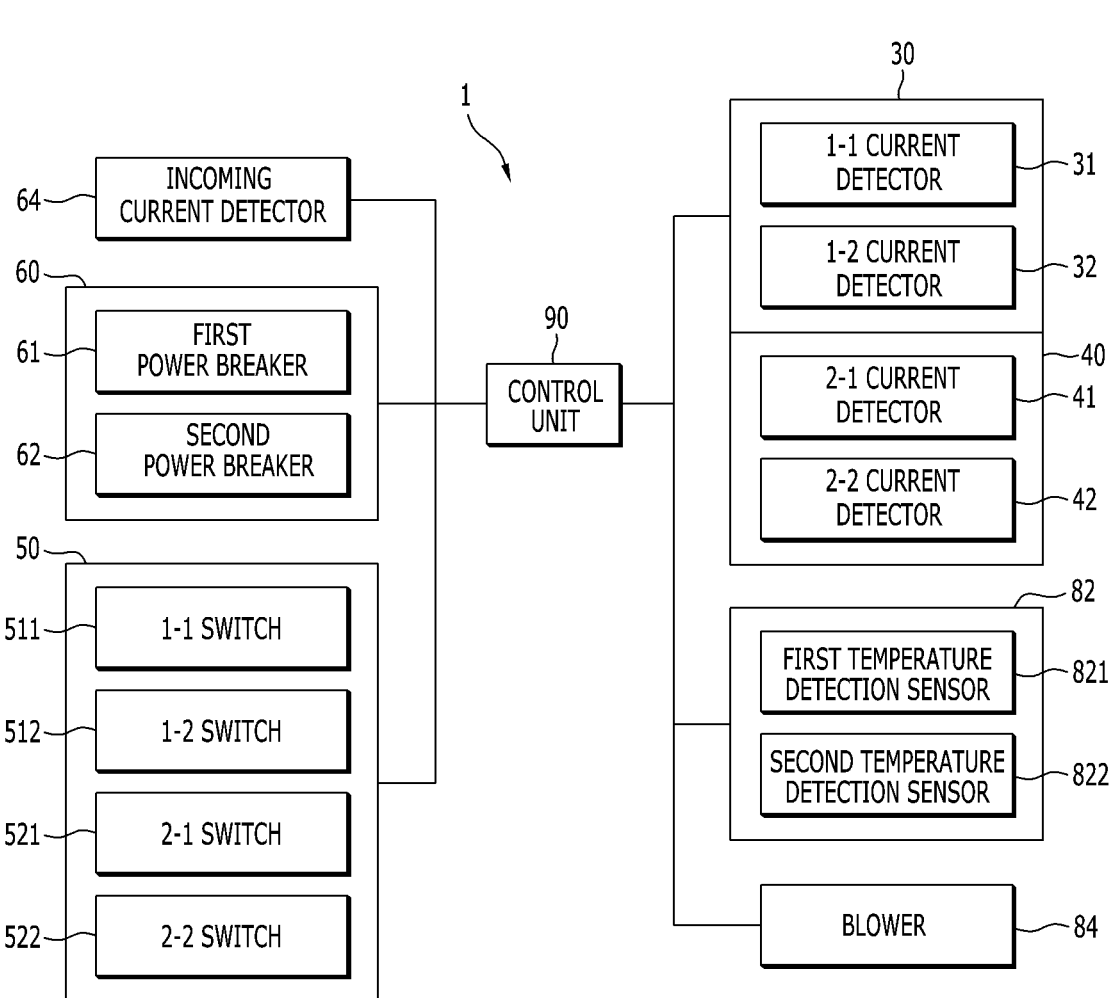
FIG. 5 is a control block diagram of the interlocking type outlet device.

FIG. 1 is a simplified diagram of the interlocking type outlet device 1 according to the present invention, FIG. 2 is a simplified diagram of a modifiable interlocking type outlet device 1, FIG. 3 is a simplified diagram of another modifiable interlocking type outlet device 1, FIG. 4 is a simplified diagram of another modifiable interlocking type outlet device 1, and FIG. 5 is a control block diagram of the interlocking type outlet device 1.

The configuration of the interlocking type outlet device 1 will be described with reference to FIGS. 1 to 5.

The interlocking type outlet device 1 includes a first outlet 10, a second outlet 20, a first current detector 30, a second current detector 40, a switch 50, a power breaker 60, an incoming current detector 64, a power supply line 70, a selective bypass valve 80, a temperature detection sensor 82, a blower 84, and a control unit 90.

The first outlet 10 receives power from an external power source and supplies the power to a connected first equipment 3.

The second outlet 20 receives the power from the external power source and supplies the power to a connected second equipment 4.

A first current detector 30 is connected to the first outlet 10 and detects that the power is supplied to the first equipment 3. A plurality of first current detectors 30 may be provided, and may include a 1-1 current detector 31 and a 1-2 current detector 32.

A second current detector 40 is connected to the second outlet 20 and detects that power is supplied to the second equipment 4. A plurality of second current detectors 40 may be provided, and may include a 2-1 current detector 41 and a 2-2 current detector 42.

The switch 50 regulates power supply to the first outlet 10 and the second outlet 20. The switch 50 includes a first switch 51 and a second switch 52.

The first switch 51 is disposed between an external power source 2 and the second outlet 20, and is connected to the first current detector 30 to regulate power supply to the second outlet 20 according to power being supplied to the first equipment 3. A plurality of first switches 51 may be provided, and may include a 1-1 switch 511 and a 1-2 switch 512.

The second switch 52 is disposed between the external power source 2 and the first outlet 10, and is connected to the second current detector 40 to regulate power supply to the first outlet 10 according to power being supplied to the second equipment 4. A plurality of second switches 52 may be provided, and may include a 2-1 switch 521 and a 2-2 switch 522.

The power breaker 60 is disposed between the external power source 2 and the first outlet 10 and the second outlet 20 to regulate the power supplied to the first outlet 10 and the second outlet 20. A plurality of power breakers 60 may be provided, and may include a first power breaker 61 and a second power breaker 62.

The incoming current detector 64 is disposed at the front end of the power breaker 60 and detects current flowing into the power breaker 60. A plurality of incoming current detectors 64 may also be provided, and an extra incoming current detector 64 may be installed in preparation for a defect.

The power supply line 70 provides a path supplying power by connecting the external power source 2 and the power breaker 60, the power breaker 60 and the switch 50, the switch 50, the power breaker 60, and the first outlet 10, and the switch 50 and the second outlet 20. The power supply line 70 may include a main supply line 71 and a bypass supply line 72.

The main supply line 71 is a power line that supplies power to the first outlet 10 and the second outlet 20.

The bypass supply line 72 may be provided with the plurality of power breakers 60 and a plurality of switches 50, and may allow the plurality of power breakers 60 and the plurality of switches 50 to be bypassed. The bypass supply line 72 may be formed by connecting the 1-1 current detector 31 and the 1-2 current detector 32, the 2-1 current detector 41 and the 2-2 current detector 42, the 1-1 switch 511 and the 1-2 switch 512, the 2-1 switch 521 and the 2-2 switch 522, and the first power breaker 61 and the second power breaker 62.

The selective bypass valve 80 may selectively connect and supply power to front and rear ends of the bypass supply line 72.

The temperature detection sensor 82 may detect the temperature of each of the first outlet 10 and the second outlet 20. The temperature detection sensor 82 may include a first temperature detection sensor 82-1 that detects the temperature of the first outlet 10 and a second temperature detection sensor 82-2 that detects the temperature of the second outlet 20.

The blower 84 may rotate a rotor blade to output wind toward the first outlet 10 and the second outlet 20.

The control unit 90 may store a normal current range flowing into the power breaker 60, and, when it is determined that incoming current detected by the incoming current detector 64 is outside the normal current range, control the power breaker 60 to cut off the power supplied to the first outlet 10 and the second outlet 20.

When any one of the first current detector 30 and the second current detector 40 detects power being supplied or cut off to the first equipment 3 and the second equipment 40, the control unit 90 may control the power to be supplied or cut off to the equipment corresponding to another one.

The control unit 90 may store a normal temperature range of the first outlet 10 and a normal temperature range of the second outlet 20, and, when it is determined that the temperature detected by each of the first temperature detection sensor 82-1 and the second temperature detection sensor 82-2 is outside at least one of the normal temperature range of the first outlet 10 and the normal temperature range of the second outlet 20, the control unit 90 may control the blower 84 to operate.

The control unit 90 may adjust a rotation speed of the rotor blade of the blower 84 according to a degree to which the temperature detected by each of the first temperature detection sensor 82-1 and the second temperature detection sensor 82-2 is outside a set range of at least one of the normal temperature range of the first outlet 10 and the normal temperature range of the second outlet 20.

Owing to the interlocking type outlet device 1 above, when supplying the current from the first outlet 10 to the first equipment 3 is detected by the first current detector 30, by controlling the switch 50 so that power may be supplied to the first outlet 10, the first equipment 3 and the second equipment 4 may be operated simultaneously so that work may be performed simultaneously, thereby improving user convenience.

In addition, when an abnormal current that may be flowing into the first outlet 10 and the second outlet 20 is detected, the power breaker 60 may cut off the power to the first outlet 10 and the second outlet 20, may allow the first equipment 3 and the second equipment 4 to perform work simultaneously, and even when any one of the first equipment 3 and the second equipment 4 stops working while the first equipment 3 and the second equipment 4 perform work simultaneously, may cut off the power so that the other one also stops working. In addition, even if the power breaker 60 and the switch 50 are defective, the power breaker 60 and the switch 50 may be replaced with an extra power breaker and switch and operate. When the power breaker 60 and switch 50 are replaced with the extra power breaker and switch and operate, the extra power breaker and switch may be selectively connected through the bypass supply line 72.

KEY TO REFERENCE NUMERALS IN THE FIGURES

FIG. 1
POWER 2
POWER BREAKER 60
FIRST OUTLET 10
FIRST EQUIPMENT 3
FIRST CURRENT DETECTOR 30
SWITCH 50
SECOND OUTLET 20
SECOND EQUIPMENT 4
FIG. 2
POWER 2
INCOMING CURRENT DETECTOR 64
POWER BREAKER 60
SECOND SWITCH 52
FIRST SWITCH 51
FIRST OUTLET 10
FIRST EQUIPMENT 3
FIRST CURRENT DETECTOR 30
SECOND CURRENT DETECTOR 40
SECOND OUTLET 20
SECOND EQUIPMENT 4
FIG. 3
POWER 2
INCOMING CURRENT DETECTOR 64
FIRST POWER BREAKER 61
SECOND POWER BREAKER 62
POWER BREAKER 60
SECOND SWITCH 52
FIRST SWITCH 51
FIRST OUTLET 10
FIRST EQUIPMENT 3
FIRST CURRENT DETECTOR 30

SECOND CURRENT DETECTOR 40
SECOND OUTLET 20
SECOND EQUIPMENT 4
FIG. 4
POWER 2
INCOMING CURRENT DETECTOR 64
FIRST POWER BREAKER 61
SECOND POWER BREAKER 62
POWER BREAKER 60
SECOND SWITCH 52
FIRST SWITCH 51
FIRST OUTLET 10
FIRST EQUIPMENT 3
1-1 CURRENT DETECTOR 31
1-2 CURRENT DETECTOR 32
2-1 CURRENT DETECTOR 41
2-2 CURRENT DETECTOR 42
SECOND OUTLET 20
SECOND EQUIPMENT 4
FIG. 5
CONTROL UNIT 90
INCOMING CURRENT DETECTOR 64
FIRST POWER BREAKER 61
SECOND POWER BREAKER 62
1-1 SWITCH 511
1-2 SWITCH 512
2-1 SWITCH 521
2-2 SWITCH 522
FIRST TEMPERATURE DETECTION SENSOR 821
SECOND TEMPERATURE DETECTION SENSOR 822
BLOWER 84

What is claimed is:

1. An interlocking type outlet device comprising:
a first outlet receiving power from an external power source and supplying the power to a first equipment;
a second outlet receiving the power from the external power source and supplying the power to a second equipment;
a first current detector connected to the first outlet and detecting that the power is supplied to the first equipment;
a switch disposed between the external power source and the second outlet and connected to the first current detector to regulate power supply to the second outlet according to power being supplied to the first equipment;
a power breaker disposed between the external power source and the first outlet and the second outlet to regulate the power supplied to the first outlet and the second outlet;
an incoming current detector disposed at a front end of the power breaker to detect current flowing into the power breaker;
a control unit storing a normal current range flowing into the power breaker, and, when it is determined that incoming current detected by the incoming current detector is outside the normal current range, controlling the power breaker to cut off the power supplied to the first outlet and the second outlet;
a power supply line providing a path supplying the power by connecting the external power source and the power breaker, the power breaker and the switch, the switch, the power breaker, and the first outlet, and the switch and the second outlet; and a bypass supply line provided with a plurality of power breakers and a plurality of switches, and allowing the plurality of power breakers and the plurality of switches to be bypassed.

2. The interlocking type outlet device according to claim 1, further comprising: a second current detector connected to the second outlet and detecting the power being supplied to the second equipment, wherein the control unit, when any one of the first current detector and the second current detector detects the power being supplied or cut off to the first equipment and the second equipment, controls the power to be supplied or cut off to equipment corresponding to another one.

3. The interlocking type outlet device according to claim 1, further comprising: a selective bypass valve selectively supplying the power to front and rear ends of the bypass supply line.

* * * * *